US007231614B2

(12) United States Patent
Best et al.

(10) Patent No.: US 7,231,614 B2
(45) Date of Patent: Jun. 12, 2007

(54) SYSTEM AND METHOD FOR DESIGN AND IMPLEMENTATION OF INTEGRATED-CIRCUIT DIGITAL FILTERS

(75) Inventors: Dennis R. Best, Lucas, TX (US); Robert O. Silco, Lucas, TX (US)

(73) Assignee: Quickfilter Technologies, Inc., Allen, TX (US)

( * ) Notice: Subject to any disclaimer, the term of this patent is extended or adjusted under 35 U.S.C. 154(b) by 456 days.

(21) Appl. No.: 10/884,200

(22) Filed: Jul. 6, 2004

(65) Prior Publication Data

US 2006/0010186 A1 Jan. 12, 2006

(51) Int. Cl.
*G06F 17/50* (2006.01)
(52) U.S. Cl. .................. 716/1; 716/3; 716/4; 716/5
(58) Field of Classification Search .................. 716/1, 716/3–5, 18; 708/300
See application file for complete search history.

(56) References Cited

U.S. PATENT DOCUMENTS

| | | | |
|---|---|---|---|
| 5,068,823 A | 11/1991 | Robinson | |
| 6,202,197 B1 | 3/2001 | Robinson et al. | |
| 6,587,995 B1 | 7/2003 | Duboc et al. | |
| 2004/0044970 A1* | 3/2004 | Anderson et al. | 716/1 |

OTHER PUBLICATIONS

Duncan, Phillip. et al, "Strategies for Design Automation of High Speed Digital Filters", Journal of VLSI Signal Processing, 9, 105-119 (1995).

Andersen, J., et al, "An Integrated Environment for Filter Design", 36th Midwest Symposium on Circuits and Systems, Aug. 16-18, 1993, pp. 788-792 vol. 2.
Henderson, R. K., "A Design Program for Digital and Analogue Filters: Pandda", European Conference on Circuit Theory and Design 1989, Sep. 5-8, 1989, pp. 289-293.
Kaiser, U., A CAD System for the Design of Digital Filter Algorithms for the Reduced-Instruction Set Digital Signal Processor RISP, IEEE Int. Sym. on Circuits and Systems 1991, Jun. 11-14, 1991, pp. 45-48 vol. 1.

* cited by examiner

*Primary Examiner*—Paul Dinh
(74) *Attorney, Agent, or Firm*—John A. Thomas

(57) ABSTRACT

A system and method for implementing a digital filter, comprising computing on a digital computer a mathematical model of a digital filter; where the mathematical model has a predetermined first set of parameters. The first set of parameters is converted to a second set of parameters, where the second set of parameters includes control parameters for a pre-selected digital-filter integrated circuit (IC). The system then verifies that the execution of the second set of parameters by the digital-filter IC substantially reproduces the behavior of the mathematical model. The verified second set of parameters is then written to permanent storage on the digital-filter IC. The system preferably reads a device-file map characteristic of the particular filter IC intended to be used to implement the filter under design. The converting of the first set of parameters to a second set of parameters further includes computing values corresponding to the second set of parameters that conform to the numerical precision available in the digital-filter IC, and assigning the values so computed to the second set of parameters. The mathematical model of the digital filter is verified by re-computing the model using the second set of parameters.

23 Claims, 5 Drawing Sheets

SYSTEM AND METHOD FOR DESIGN AND IMPLEMENTATION OF INTEGRATED-CIRCUIT DIGITAL FILTERS

FIELD OF THE INVENTION

This disclosure relates to the design, implementation and testing of electronic digital filters to meet particular specifications.

BACKGROUND

The techniques and algorithms for computing a mathematical solution to a desired set of filter specifications are well known by experienced filter designers. Modern solutions most often employ digital filter techniques for increased stability, versatility, and lower cost than prior analog techniques. Digital filters usually are intended to select a desired frequency band from an electronic signal containing both the desired frequencies and undesirable noise frequencies.

Current filter design practices typically require a highly experienced analog electrical engineer with extensive knowledge of the signal processing chain of the relevant system, as well as the principles of noise sources and noise abatement techniques. The designer must be proficient in the use of various filter design simulators and tools and keep up with the capabilities of currently available filter integrated circuits. Once the designer has determined the approximate requirements for a needed filter in a system (such as through measurement of noise conditions or by the frequency plan of the system in design), he must then select a design method for arriving at an implementation; this will be the number of filter taps and the filter coefficient values. The design method commonly used today is the Parks-McClellan equi-ripple polynomial approximation algorithm.

There are several available software packages based upon Parks-McClellan and other algorithms that will generate coefficients and the number of taps required for a given specification. These are mathematical solutions, however. The designer must find the part or parts to implement the solution and account for any error terms as a result of constrained precision of numerical representations or variances in the components. This may require several iterations of both the design method phase and the implementation phase to arrive at an acceptable solution. Also, the translation of the resulting coefficients and device control parameters to the selected parts can be a formidable task.

There is a need for a system that can implement digital filters by closing the design loop between the purely mathematical design of a filter and the detailed hardware embodiment of that filter. In other words, the designer should be able to perform mathematical design, select appropriate hardware, simulate and verify the design as it would be executed by that hardware, and translate the operations and control parameters of the design to its final hardware embodiment, all within a single integrated system.

SUMMARY

We disclose a method for implementing a digital filter, comprising computing on a digital computer a mathematical model of a digital filter; where the mathematical model has a predetermined first set of parameters. The first set of parameters is converted to a second set of parameters, where the second set of parameters includes control parameters for a pre-selected digital-filter integrated circuit (IC). The system then verifies that the execution of the second set of parameters by the digital-filter IC substantially reproduces the behavior of the mathematical model. The verified second set of parameters is then written to permanent storage on the digital-filter IC. The system preferably reads a device-file map characteristic of the particular filter IC intended to be used to implement the filter under design.

The converting of the first set of parameters to a second set of parameters further includes computing values corresponding to the second set of parameters that conform to the numerical precision available in the digital-filter IC, and assigning the values so computed to the second set of parameters. The mathematical model of the digital filter is verified by re-computing the model using the second set of parameters.

DETAILED DESCRIPTION

Figure 1:
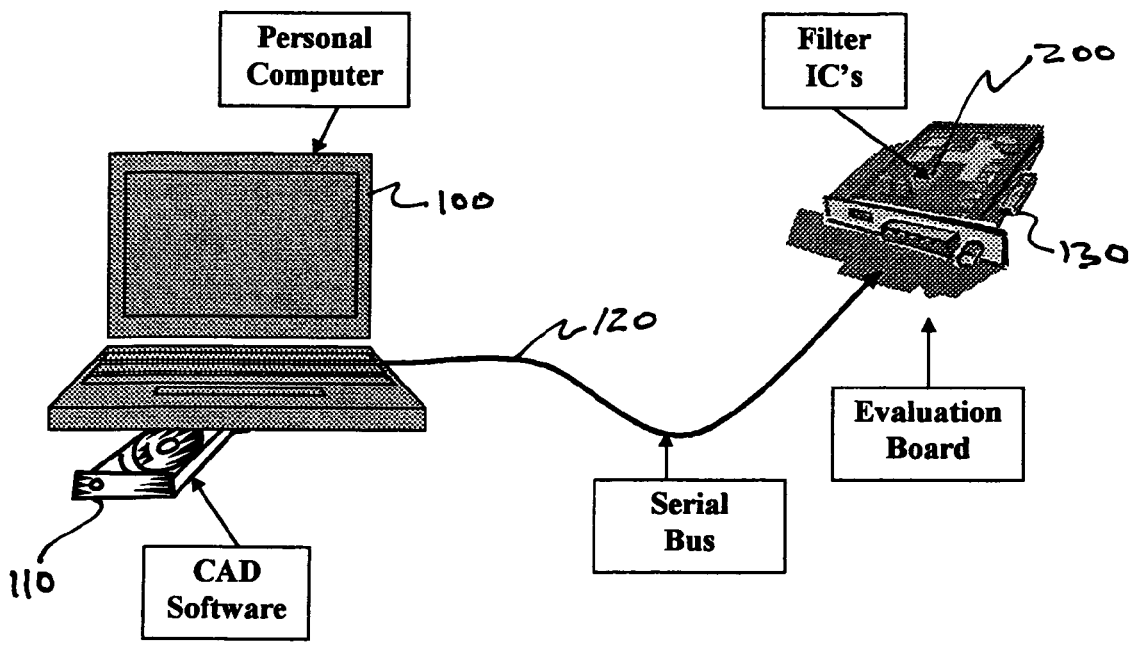
FIG. 1 shows an overall view of the system hardware of the preferred embodiment.

FIG. 1 shows the overall hardware connections of the preferred embodiment. A computer (100) executes filter-design software (110), which software (110) includes the methods disclosed in this specification. The computer (100) typically has a processor, a RAM, and a mass storage device, such as a hard drive. The computer (100) is connected via a data bus (120) to an evaluation circuit board (130). The data bus (120) is preferably a serial bus, such as the Universal Serial Bus (USB) standard, although other data-bus protocols could be used.

Hardware Implementation

The evaluation board (130) is configured to connect with a digital-filter integrated circuit (IC) (200). The filter IC (200) is a mixed-signal, silicon integrated circuit. The device preferably has a serial bus interface for communicating with the PC; a non-volatile memory for storing the filter coefficients and the device control parameters; a static, random-access memory for storing the digitized input data stream and intermediate results of the filtering operation; one or more arithmetic units for performing the add, multiply, and accumulate operations associated with filter computations; and the necessary program control, clock generation and control, power conditioning, and power-on reset functions for chip operation. The IC may also have an analog-to-digital converter (ADC), and a digital-to-analog converter (DAC) and related anti-aliasing and reconstruction filters, and signal-conditioning circuitry, to allow the filter to interface directly with analog data input and output.

Figure 2:
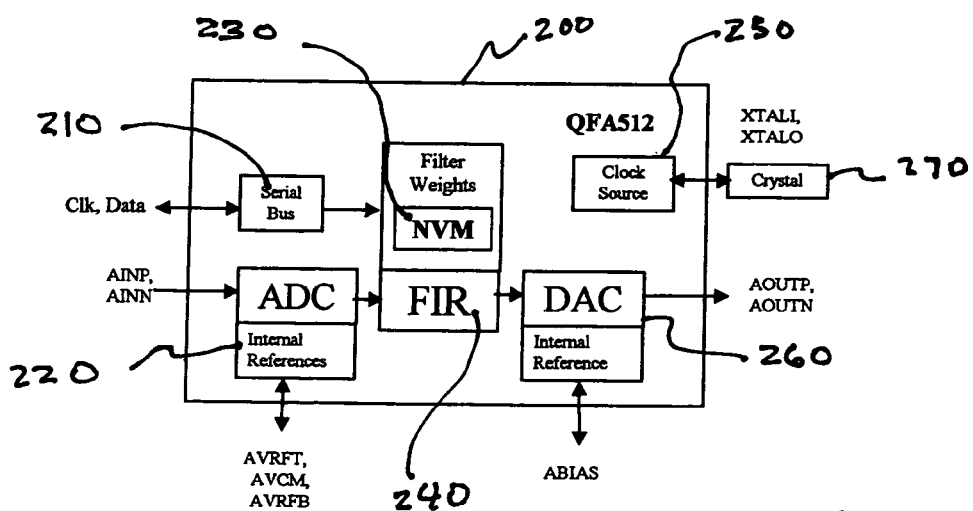
FIG. 2 shows an overall view of a digital filter integrated circuit of the preferred embodiment.

FIG. 2 is an overview of such an IC (200) in the preferred embodiment. Typically, the IC (200) has an input (210) for the serial bus (120). As described below, the serial bus (120)

carries programming instructions and data defining a particular digital filter. The IC (200) has an ADC (220) for input of analog signals to be processed. In other embodiments of the system, the input to the IC (200) may be a digital signal, and no ADC will be required.

The IC (200) has an area of non-volatile memory (230) for storage of filter coefficients and control parameters, as described below. The IC thus includes a processor (240), as described below, to perform the required digital-filter calculations according to the filter coefficients and control parameters downloaded into it when it is connected to the evaluation board (130). The results of these calculations are typically placed into a DAC (260) for output, although other embodiments omit the DAC (260) and output a digital data stream. The chip will have a clock source (250) typically controlled by an external crystal (270). The reader should note that the processor (240) is not a conventional digital-signal microprocessor, but is rather a special integrated circuit adapted to accept filter coefficients and control parameters that define a specified digital filter.

Figure 3:
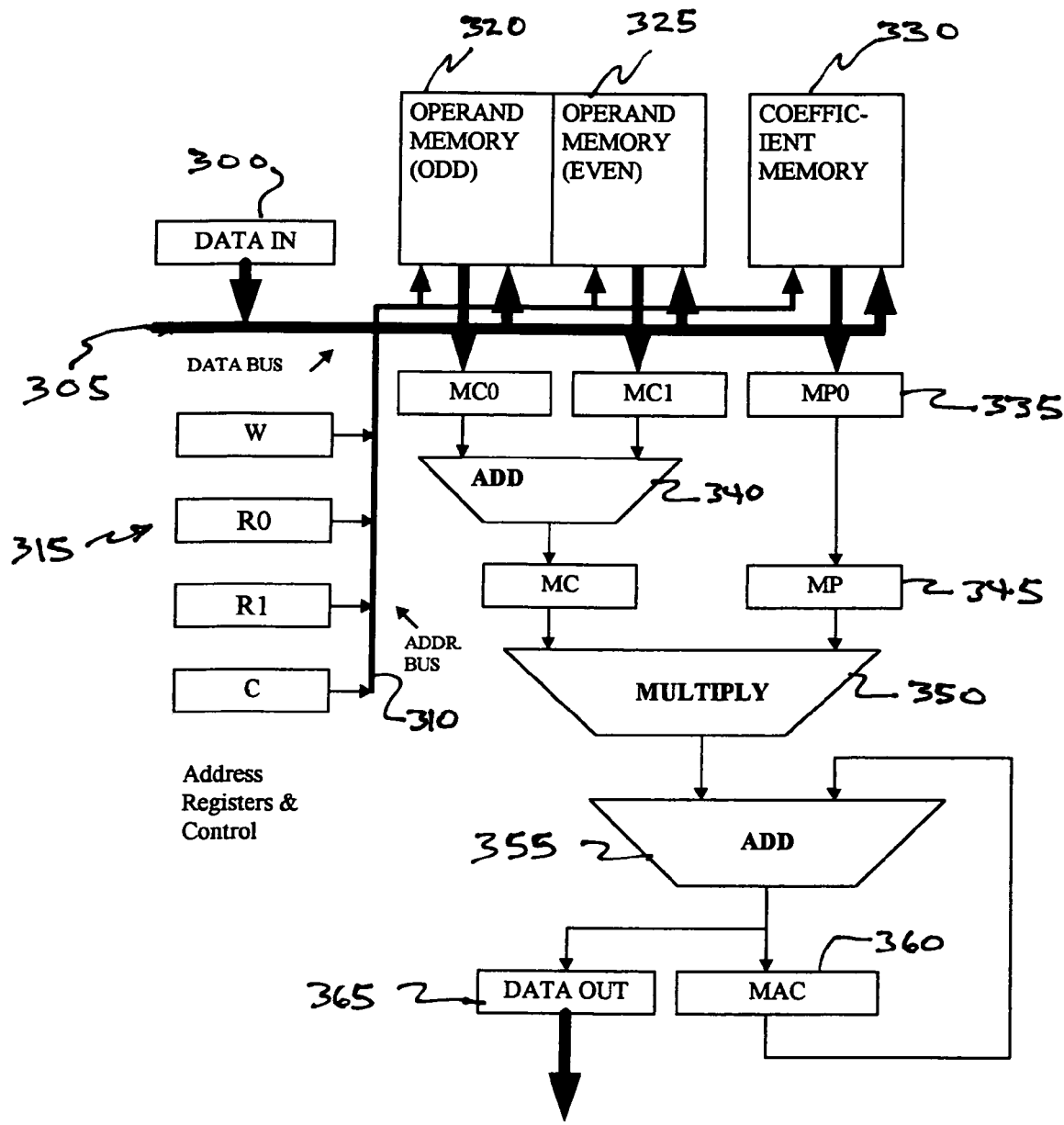
FIG. 3 shows the plan of the digital filter processor portion of the preferred embodiment.

FIG. 3 shows the plan for the processor (240) portion of the preferred embodiment. The filter IC (200), and thus the processor (240), may be embodied in an application-specific IC (ASIC), or it may be implemented in a field-programmable gate array chip if only a digital I/o solution is desired, such as the Virtex II chip manufactured by Xilinx, Inc. of San Jose, Calif. Such implementations are greatly preferable to a conventional digital-signal microprocessor, because they can execute filter operations much faster. The processor (240) receives data through a data port (300). The data port (300) is connected to a data bus (305). An address bus (310) connects address and control registers (315). The data bus (305) and the address bus (310) connect to odd operand memory (320), even operand memory (325) and coefficient memory (330). According to the control instructions, as discussed below, the processor (240) implements the typical mathematical operations required for signal processing digital filters and also controls the input and output interfaces. In the preferred embodiment, there is a first set of multiplicand and multiplier registers (335), a first adder (340) that produces a second multiplicand; a second set of multiplicand and multiplier registers (345), a multiplier (350), a second adder (355), and a final multiply-and-accumulate register (360). A data output port (365) presents computed results from the second adder (355).

A design for a typical digital filter IC (200) of the preferred embodiment may be specified as follows for a filter with 3 memory or register banks, where one bank is for coefficients, having an address range of 0-255, and two banks are for data, with odd/even interleaved addresses in the range of 0-511. The maximum number of taps in the design illustrated is 512, although the design could be extended to any number of taps consistent with the hardware available.

Initialization:
  Power-on-reset clears all registers, establishes a default clock, and initiates the download of control and filter parameters from the on-board nonvolatile memory. This download initializes all address and control registers, writes the filter coefficients into the coefficient memory (or registers), and zeros the data memory. Address and control registers are set to the appropriate values, and the analog sections are initialized, if used.

Input/Output:

| | |
|---|---|
| Data In | Operand from input pins or ADC, clocked into Data In register |
| DI0 | Data In Valid Control register set by input pin or ADC |
| Data Out | Filter output to output pin or DAC |
| DO2 | Data Out Valid Control from filter to output pin or DAC reset by external device or DAC |

Initial Values:
  Where N=number of taps of the filter
  R0=Memory address register for operand to fill Multiplicand 0 register (MC0)
  R1=Memory address register for operand to fill Multiplicand 1 register (MC1)
  C=Memory address register for coefficient to fill Multiplier 0 register (MP0)
  CTR=Counter to countdown number of taps
  W=Memory address register for store location of next data point
  R0=0, R1=N−1, C=0, CTR=N−1, W=N−1

Data Write Controller:
  IF DI0=0, THEN WAIT
  ELSE, (W)=Data In, DI0'=0, DI1'=1
  IF W=0, THEN W'=N−1
  Else, W'=W−1

Operand Fetch Controller:
  IF DI1=0, THEN WAIT
  ELSE MC0'=(R0), MC1'=(R1), MP0'=(C)
  IF CTR=0, THEN R0'=0, R1'=N−1, C'=0, CTR'=N−1, DI1=0, DO0=,
  DI2=DI1
  ELSE
  IF C=N/2−1, THEN R0'=CTR, R1'=CTR-1, C'=0, CTR'=CTR-1
  ELSE
  IF R0=N−1, THEN R0'=0
  ELSE R0'=R0+1
  IF R1=0, THEN R1'=N−1
  ELSE R1'=R1−1

ADD Controller:
  IF DI2=0, THEN WAIT
  ELSE    MC'=MC0+MC1,    MP'=MP0,    DI3'=DI2, DO1'=DO0, DO0'=0

MAC Controller:
  IF DI3=0, THEN WAIT
  ELSE MAC'=MAC+(MC×MP)
  IF DO1=1, THEN DATAOUT'=MAC=(MC×MP), DO1'=0, DO2'=1 (DO2 reset by receiving logic—external or DAC)

Software Implementation

The preceding section described a typical hardware implementation of the preferred embodiment. The following sections describe the software processes of the preferred embodiment.

Mathematical Design

Figure 4:
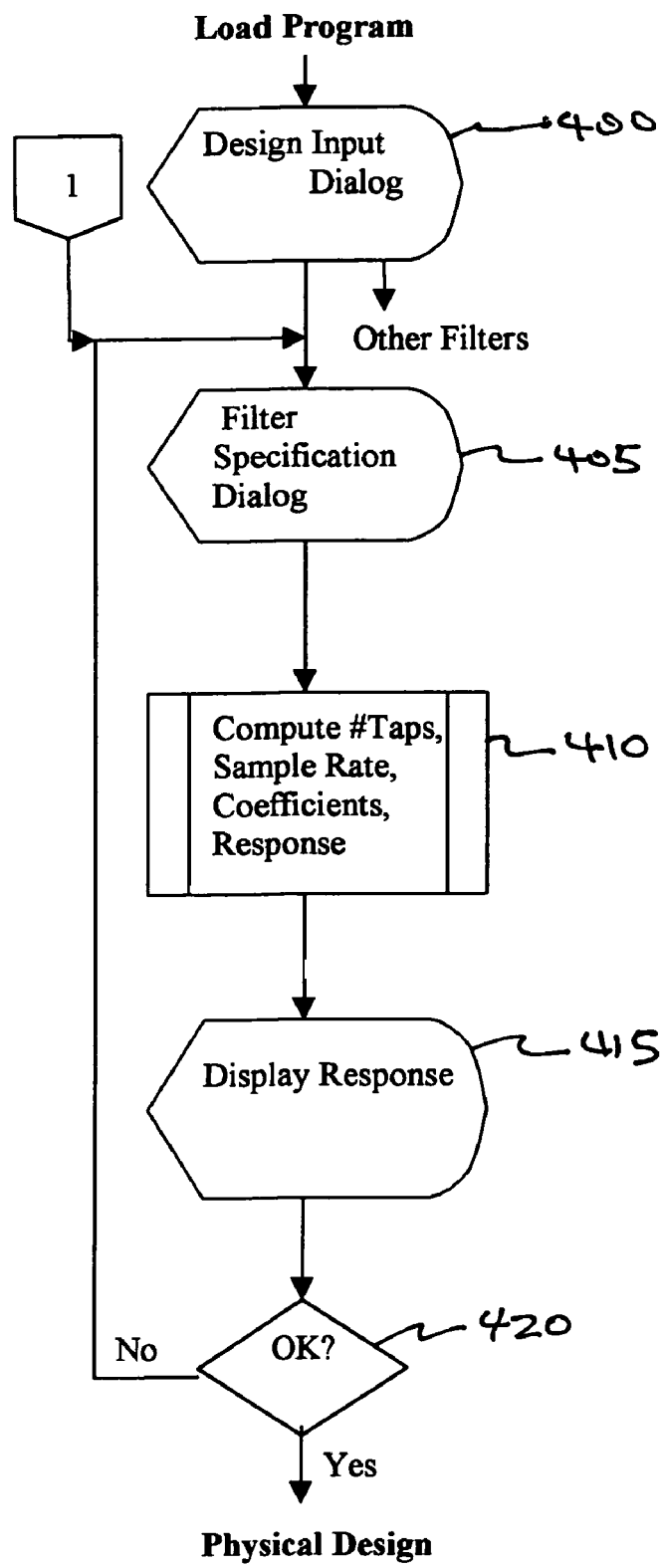
FIG. 4 is a flowchart of the steps for mathematical design of a digital filter in the preferred embodiment.

FIG. 4 shows the flow of execution in the software process for the design portion of the system. A user interacts with a design-input dialog at step 400. In this dialog, the user can select the desired filter type, such as lowpass, highpass, bandpass or bandstop, the desired windowing function, and the frequency range. At step 405, the user can select the cutoff frequency, stopband frequency, ripple, attenuation, and the sample rate, and the bit length (or precision) of the input and output data stream. At step 410, the software computes the number of filter taps, the sample rate, the filter coefficients, and the response, using conventional techniques, such as the Parks-McClellan method. The resulting filter response is displayed at step 415, and at step 420, the user can approve the designed filter, or return to modify the design and repeat the process. This first set of parameters represents the ideal mathematical design for the desired filter. When the user approves the filter design at step 420, execution passes to step 500, shown on FIG. 5.

Conversion to Physical Constraints

Figure 5:
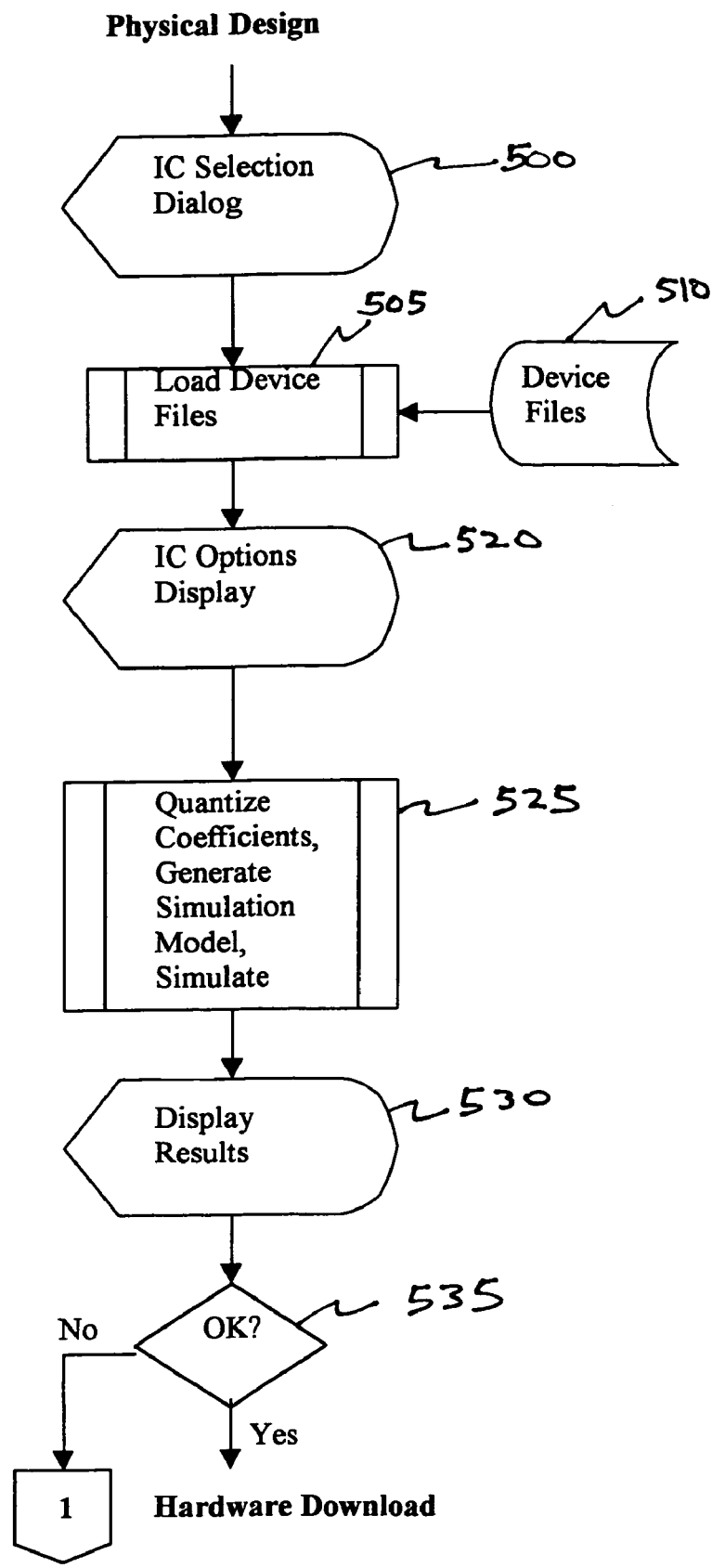
FIG. 5 is a flowchart of the steps for design of a physical implementation of a digital filter in the preferred embodiment.
Figure 6:
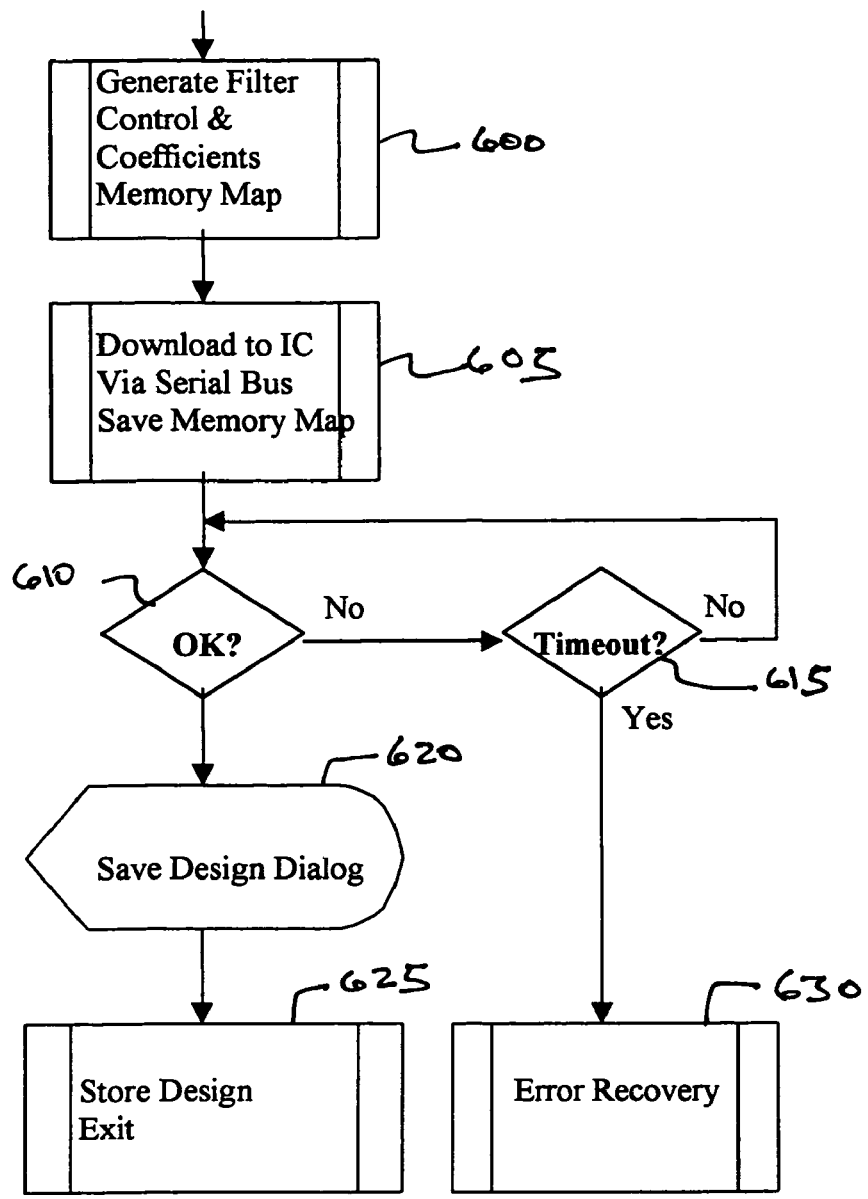
FIG. 6 is a flowchart of the steps for hardware download of digital filter parameters in the preferred embodiment.

FIG. 5 depicts the flow of execution for the physical design of the filter just computed. At step 500, the user selects a digital-filter IC (200) having the parameters suitable for the mathematical design, such as memory capacity, execution speed, and desired analog features. Preferably, the program should not proceed if there is no device in the device file that can execute the desired filter. At step 505, the program then loads the device file (510) for that filter IC (200). The device file is discussed in the following section.

Device File

The device file contains all control fields, initial register values, and coefficient values necessary to program the operation of a filter for up to N taps. These fields also define the mode of operation of the device, including input/output selection and data types, sample/clock rates, ADC/DAC enablement and gain settings, anti-aliasing filter settings, cascaded integrator-comb (CIC) filter decimation values, and communication interface mode and protocol.

These control parameters are memory mapped into the non-volatile storage on the device, and also into the memory and registers on the device. This map tells the software what must be configured for each device type. The device may operate on the input data stream with one or more filters, up to the capacity of the on-chip memory, and within the maximum rate values. Each filter on the device requires a memory map as next described.

The data structure of a typical device file map is shown in the table below. The table illustrates the file organization for a filter device with an anti-aliasing filter and ADC for analog inputs, followed by a decimating CIC filter and the N-tap digital filter hardware. The output section in the example includes a DAC. The filter may be used in a digital only mode with either serial or parallel I/O, or the ADC and DAC can be individually enabled to provide an analog filter replacement.

| FUNCTION | ADDRESS | DATA |
|---|---|---|
| Coefficients | 0 | Coefficient 0 |
|  | 1 | Coefficient 1 |
|  | . | . |
|  | . | . |
|  | . | . |
|  | 255 | Coefficient 255 |
| FIR Control Initial Values | 256 | Data Write Address (W = N - 1) |
| (N = Number of Taps) | 257 | Operand A Read Address (R0 = 0) |
|  | 258 | Operand B Read Address (R1 = N - 1) |
|  | 259 | Coefficient C Read Address (C = 0) |
|  | 260 | Tap Counter Loop Control (CTR = N - 1) |
|  | 261 | Scale Factor |
| Reserved | 262 |  |
|  | . |  |
|  | . |  |
|  | . |  |
| Input/Output Control | 268 | Data/Coefficient bit length/format Digital Input enable, Serial or Parallel Analog Input enable, differential/single ended Digital Output enable, serial or parallel Analog Output enable, differential/single ended |
| Clock/Sample Rate Control | 274 | ADC Clock, CIC Clock, FIR Clock PLL Control, PLL Status, Chip enable Power-On-Reset Delay |
| Communication Interface | 278 | Mode (I2C, SPI), Protocol |
| Anti-Aliasing Filter | 280 | Cut-off Frequency, Gain, Bypass, Enable |
| ADC | 282 | Scale Factor, Enable |
| DAC | 284 | Gain, Enable |
|  | . |  |
|  | . |  |
|  | . |  |
|  | 511 |  |

Simulation and Verification

At step 520, the user can select various options for the filter IC (200), such as digital or analog input or output, analog input gain, digital output gain and similar parameters. Execution then passes to step 525, where the computed coefficients are quantitized for the particular filter IC architecture. The mathematical modeling described above is preferably done with 32-bit floating-point numbers. These must be converted to two's compliment binary form or other form compatible with the hardware of the filter IC (200). It is thus necessary to generate a simulation of the filter using coefficients quantitized for fixed binary arithmetic and for calculations in the same format, so that the hardware implementation of the filter on the filter IC (200) will satisfactorily reproduce the desired filter response. In the preferred embodiment, this is accomplished at step 525 by re-running the simulation using values appropriately quantitized. For example, the simulation may be re-run using 16-bit, two's complement arithmetic, giving four decimal digits of accuracy, instead of the typical 15 decimal digits of accuracy achieved by floating-point calculations. In filters where accuracy is more important, such as those with large numbers of taps, 20-bit fixed-point arithmetic may be used, and the filter IC (200) constructed to perform calculations at this precision.

The results of this simulation are displayed at step 530. If the results are not satisfactory, the user can return to step 405 to modify filter parameters. If the results are satisfactory, then the data representing the result is ready to download to the filter IC (200). This second set of parameters includes both the coefficients for the filter under design, as well as control parameters for the operation of the filter. The second set of parameters thus represents a complete functional digital filter that can be executed on the filter IC. The data set may be downloaded into the filter IC (200) on the evaluation board (130) for further engineering evaluation, or into one or more filter IC's (200) on a programming fixture to create pre-programmed chips for use in a system. Alternatively, the data may be stored on a user's system for real-time download as needed in the user's end equipment. In general, the calculated data set representing the digital filter can be stored on computer-readable media such as hard disks, CD-ROMS, Flash ROMS, nonvolatile ROM and RAM.

Since those skilled in the art can modify the specific embodiments described above, we intend that the claims be interpreted to cover such modifications and equivalents.

We claim:

1. A method for implementing a digital filter, comprising:
   computing on a digital computer a mathematical model of a digital filter; the mathematical model having a predetermined first set of parameters;
   converting the first set of parameters to a second set of parameters, where the second set of parameters includes control parameters for a pre-selected digital-filter integrated circuit (IC), where the digital-filter IC has a digital processor for executing arithmetic operations;
   verifying that the execution of arithmetic operations on the second set of parameters by the digital-filter IC substantially reproduces the behavior of the mathematical model; and,
   writing the verified second set of parameters to permanent storage on the digital-filter IC.

2. The method of claim 1 where the converting of the first set of parameters to a second set of parameters further comprises:
   computing values corresponding to the second set of parameters that conform to a numerical precision of the digital processor of the digital-filter IC; and
   assigning the values so computed to the second set of parameters.

3. The method of claim 1 where the verifying that the execution of the second set of parameters by the digital-filter IC substantially reproduces the behavior of the mathematical model further comprises re-computing the mathematical model of the digital filter using the second set of parameters.

4. The method of claim 3 further comprising graphically comparing the re-computed mathematical model with the first-computed mathematical model of the digital filter.

5. The method of claim 1 where writing the verified second set of parameters to permanent storage on the digital-filter IC further comprises writing control and coefficient parameters for the digital-filter IC.

6. The method of claim 1 where the converting the first set of parameters to a second set of parameters further comprises reading a device file map.

7. A computer-readable medium having computer executable instructions to be executed by a processor for performing a method comprising:
   computing on a digital computer a mathematical model of a digital filter; the mathematical model having a predetermined first set of parameters;
   converting the first set of parameters to a second set of parameters, where the second set of parameters includes control parameters for a predetermined digital-filter IC, where the digital-filter IC has a digital processor for executing arithmetic operations;
   verifying that the execution of arithmetic operations on the second set of parameters by the digital processor of the digital-filter IC substantially reproduces the behavior of the mathematical model; and,
   writing the verified second set of parameters to permanent storage on the digital-filter IC.

8. The computer-readable medium of claim 7 where the converting of the first set of parameters to a second set of parameters further comprises:
   computing values corresponding to the second set of parameters that conform to a numerical precision of the processor of the digital-filter IC; and
   assigning the values so computed to the second set of parameters.

9. The computer-readable medium of claim 7 where the verifying that the execution of the second set of parameters by the digital-filter IC substantially reproduces the behavior of the mathematical model further comprises re-computing the mathematical model of the digital filter using the second set of parameters.

10. The computer-readable medium of claim 9 further comprising graphically comparing the re-computed mathematical model with the first-computed mathematical model of the digital filter.

11. The computer-readable medium of claim 7 where writing the verified second set of parameters to permanent storage on the digital-filter IC further comprises writing control and coefficient parameters for the digital-filter IC.

12. The computer-readable medium of claim 7 where the converting the first set of parameters to a second set of parameters further comprises reading a device file map.

13. The computer-readable medium of claim 7 further having stored thereon a data structure comprising:
    a plurality of fields for the sequential storage of digital filter coefficients;
    an input/output control field;
    a clock/sample rate field;
    a communications interface mode field; and,
    an anti-aliasing filter control field.

14. The computer-readable medium of claim 13 further having an analog-to-digital converter control field.

15. The computer-readable medium of claim 13 further having a digital-to-analog converter control field.

16. A computer system comprising, a programmable digital-filter IC, where the digital-filter IC has a digital processor for executing arithmetic operations, a programmable digital computer, and a bus connecting the digital-filter IC and the programmable digital computer;
    the digital computer containing instructions for implementing a digital filter, comprising:
    computing on the digital computer a mathematical model of a digital filter; the mathematical model having a predetermined first set of parameters;
    converting the first set of parameters to a second set of parameters, where the second set of parameters, where the second set of parameters includes control parameters for the digital-filter IC;
    verifying that the execution of arithmetic operations on the second set of parameters by the digital-filter IC substantially reproduces the behavior of the mathematical model; and,
    writing the verified second set of parameters to permanent storage on the digital-filter IC.

17. The computer system of claim 16 where the converting of the first set of parameters to a second set of parameters further comprises:
- computing values corresponding to the second set of parameters that conform to a numerical precision of the processor of the digital-filter IC; and
- assigning the values so computed to the second set of parameters.

18. The computer system of claim 16 where the verifying that the execution of the second set of parameters by the digital-filter IC substantially reproduces the behavior of the mathematical model further comprises re-computing the mathematical model of the digital filter using the second set of parameters.

19. The computer system of claim 18 further comprising graphically comparing the re-computed mathematical model with the first-computed mathematical model of the digital filter.

20. The computer system of claim 16 where writing the verified second set of parameters to permanent storage on the digital-filter IC further comprises writing control and coefficient parameters for the digital-filter IC.

21. The computer system of claim 16 where the converting the first set of parameters to a second set of parameters further comprises reading a device file map.

22. The computer system of claim 16 where the digital-filter IC further has an analog-to-digital converter for converting analog input signals.

23. The computer system of claim 16 where the digital-filter IC further has a digital-to-analog converter for outputting analog signals.

* * * * *